(12) United States Patent
Hamaguchi et al.

(10) Patent No.: US 11,031,752 B2
(45) Date of Patent: Jun. 8, 2021

(54) SURFACE-EMITTING LASER AND ELECTRONIC APPARATUS

(71) Applicant: Sony Corporation, Tokyo (JP)

(72) Inventors: Tatsushi Hamaguchi, Kanagawa (JP); Jugo Mitomo, Kanagawa (JP); Hiroshi Nakajima, Kanagawa (JP); Masamichi Ito, Miyagi (JP); Susumu Sato, Kanagawa (JP); Noriyuki Futagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/463,309

(22) PCT Filed: Oct. 19, 2017

(86) PCT No.: PCT/JP2017/037829
§ 371 (c)(1),
(2) Date: May 22, 2019

(87) PCT Pub. No.: WO2018/096850
PCT Pub. Date: May 31, 2018

(65) Prior Publication Data
US 2019/0334318 A1    Oct. 31, 2019

(30) Foreign Application Priority Data

Nov. 24, 2016  (JP) ............................. JP2016-227977

(51) Int. Cl.
*H01S 5/183* (2006.01)
*H01S 5/187* (2006.01)
*H01S 5/125* (2006.01)

(52) U.S. Cl.
CPC .............. *H01S 5/187* (2013.01); *H01S 5/125* (2013.01); *H01S 5/18308* (2013.01)

(58) Field of Classification Search
CPC ...... H01S 5/187; H01S 5/18308; H01S 5/125; H01S 5/183
See application file for complete search history.

(56) References Cited

U.S. PATENT DOCUMENTS 5,729,566 A  3/1998 Jewell
5,764,674 A  6/1998 Hibbs-Brenner et al.
(Continued)

FOREIGN PATENT DOCUMENTS

JP    08-213701      8/1996
JP    H08-213701 A   8/1996
(Continued)

OTHER PUBLICATIONS

International Search Report and Written Opinion issued in connection with International Patent Application No. PCT/JP2017/037829 dated Dec. 19, 2017. (9 pages).
(Continued)

*Primary Examiner* — Yuanda Zhang
(74) *Attorney, Agent, or Firm* — K&L Gates LLP

(57) ABSTRACT

A surface-emitting laser according to an embodiment of the present disclosure includes a current constriction region having an opening and formed by impurities injected into a laminate from side of a second semiconductor layer; and a first DBR layer on side of a first semiconductor layer and a second DBR layer on the side of the second semiconductor layer having the laminate interposed therebetween at a position facing the opening. At the opening, an opening diameter close to the first DBR layer is larger than an opening diameter close to the second DBR layer.

8 Claims, 9 Drawing Sheets

(56) References Cited

U.S. PATENT DOCUMENTS

| | | | |
|---|---|---|---|
| 5,812,577 A | 9/1998 | Dawson | |
| 6,658,040 B1 * | 12/2003 | Hu | H01S 5/04254 |
| | | | 372/96 |
| 6,751,245 B1 * | 6/2004 | Wasserbauer | H01S 5/18341 |
| | | | 372/46.01 |
| 2003/0123502 A1 | 7/2003 | Biard et al. | |
| 2003/0123514 A1 * | 7/2003 | Cox | H01S 5/18333 |
| | | | 372/96 |
| 2013/0034117 A1 | 2/2013 | Hibbs-Brenner et al. | |
| 2013/0188659 A1 | 7/2013 | Kondo | |

FOREIGN PATENT DOCUMENTS

| | | |
|---|---|---|
| JP | 11-068227 | 3/1999 |
| JP | H11-068227 A | 3/1999 |
| JP | 2000-514244 | 10/2000 |
| JP | 2000-514244 A | 10/2000 |
| JP | 2003-264346 | 9/2003 |
| JP | 2003-264346 A | 9/2003 |
| JP | 2005-044964 | 2/2005 |
| JP | 2005-044964 A | 2/2005 |
| JP | 2010-123921 | 6/2010 |
| JP | 2010-123921 A | 6/2010 |
| JP | 2010-192824 | 9/2010 |
| JP | 2011-029607 | 2/2011 |
| JP | 2011-151364 A | 8/2011 |
| JP | 2011-151374 | 8/2011 |
| JP | 2013-172715 A | 9/2013 |
| JP | 2013-175712 | 9/2013 |
| WO | 2017/018017 A1 | 2/2017 |

OTHER PUBLICATIONS

Hashemi, et al. "Engineering the Lateral Optical Guiding in Gallium Nitride-Based Vertical-Cavity Surface-Emitting Laser Cavities to Reach the Lowest Threshold Gain," Japanese Journal of Applied Physics 52 (2013) 08JG04. (5 pages).

Shin et al. "780nm oxidised vertical-cavity surface-emitting lasers with AI0.11Ga0.89As quantum wells," Electronics Letters, 32, 1287, 1996. (2 pages).

Hamaguchi et al, "Milliwatt-class GaN-based blue vertical-cavity surface-emitting lasers fabricated by epitaxial lateral overgrowth;" Phys. Status Solidi A, 1-7(2016)/DOI 10.100 2/ pssa.20 1532759. (8 pages).

\* cited by examiner

[ FIG. 1 ]
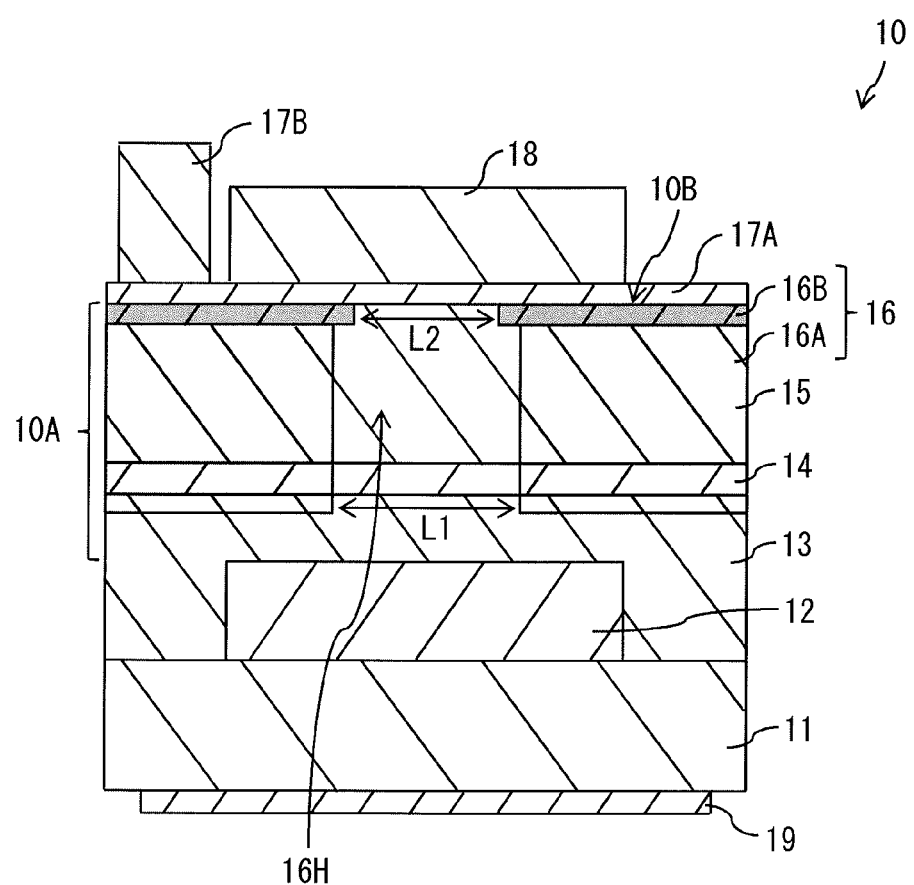

[ FIG. 2A ]
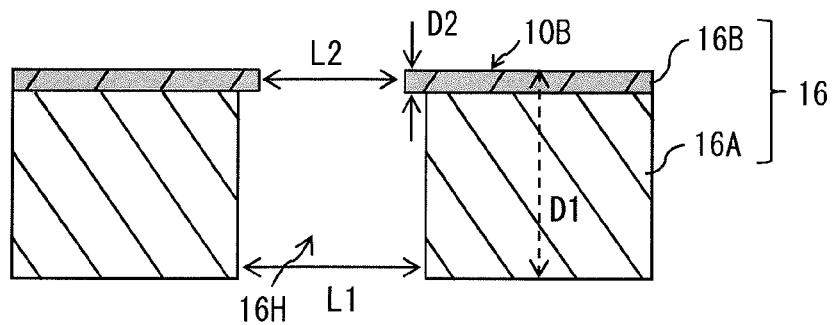
[ FIG. 2B ]
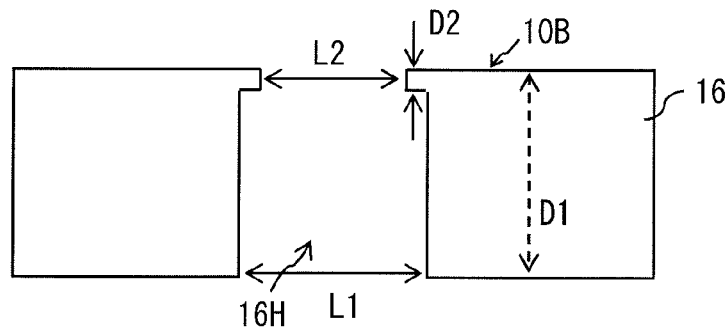
[ FIG. 2C ]
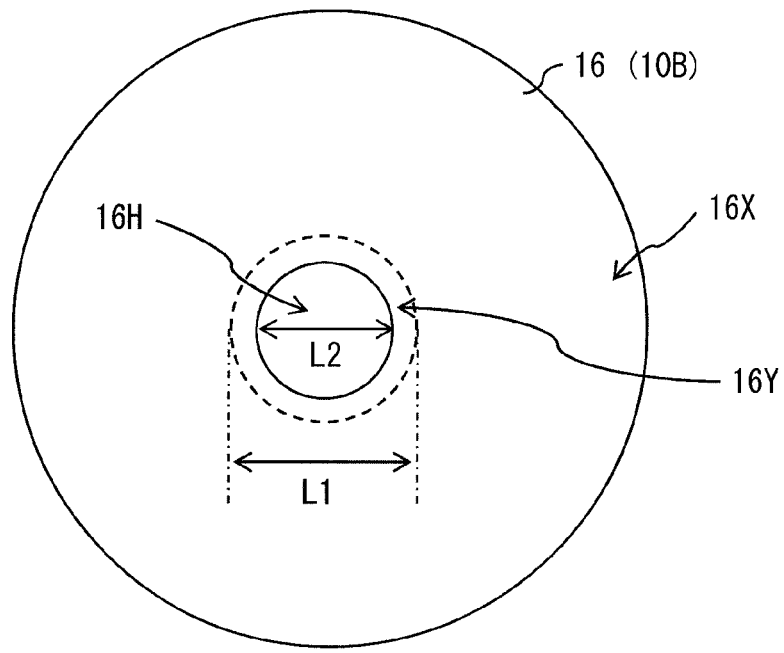

[FIG. 3]
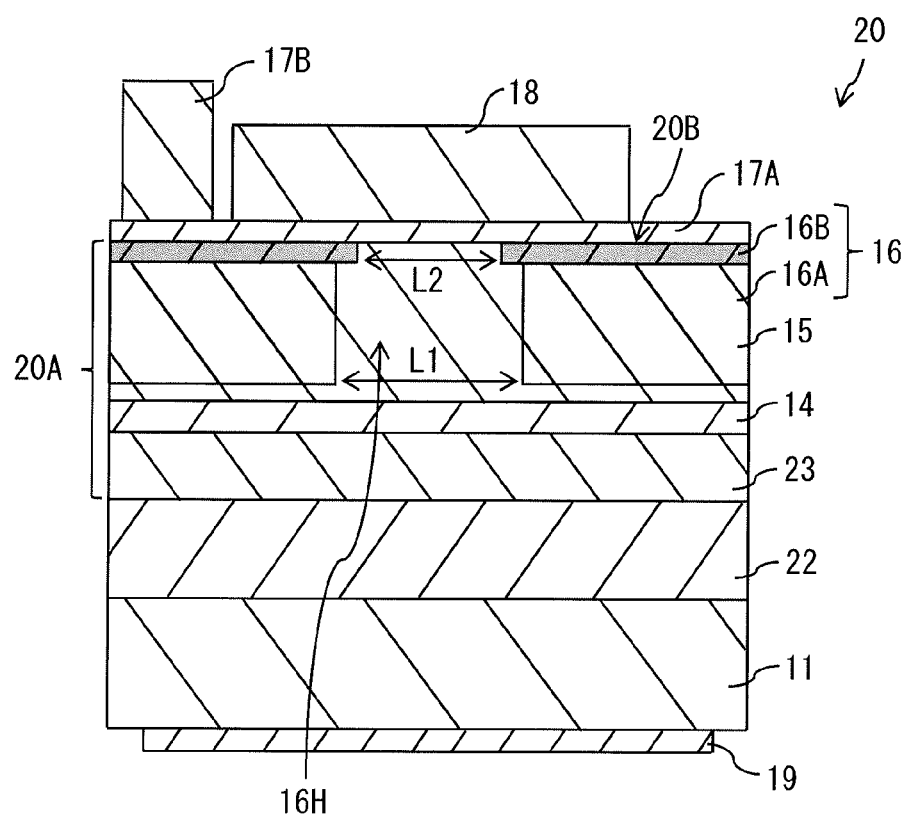

[ FIG. 4 ]
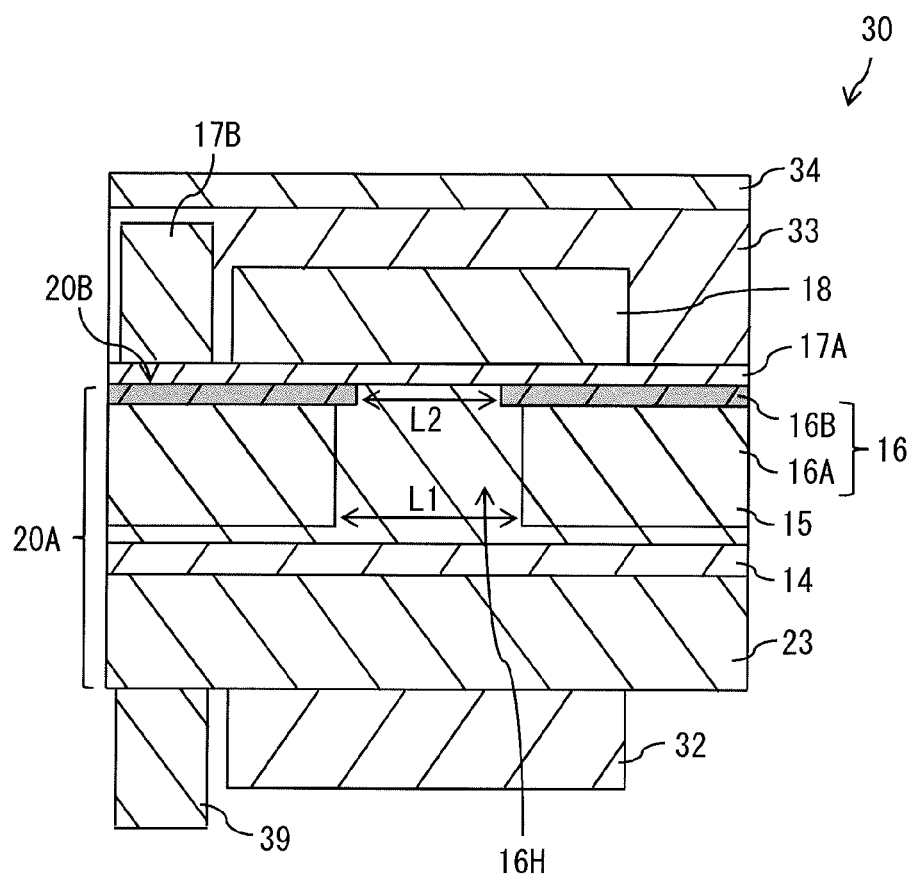

[ FIG. 5 ]
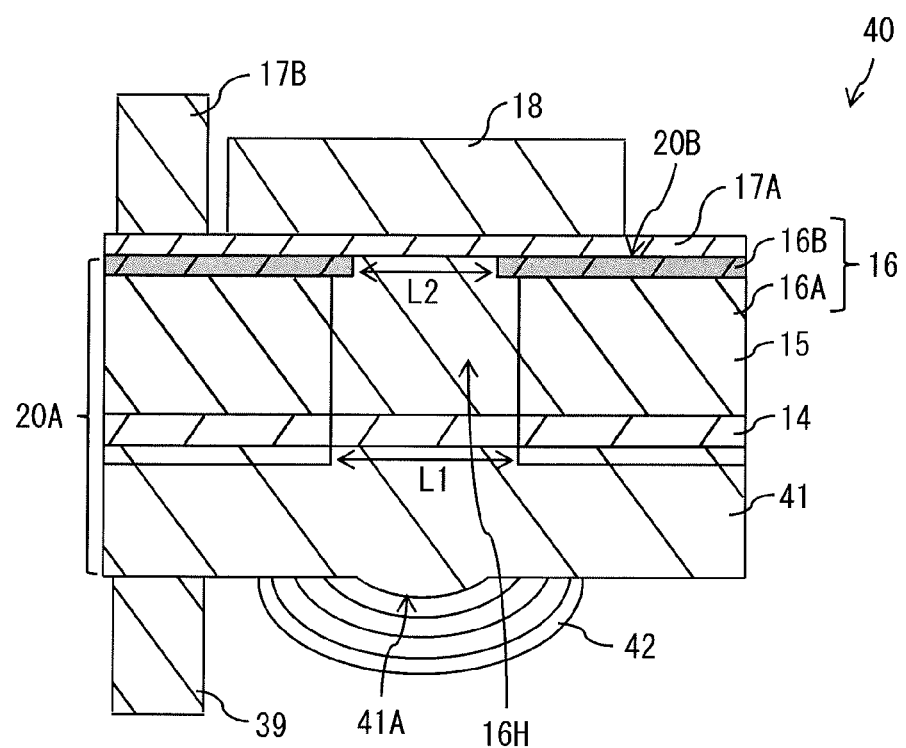

[ FIG. 6A ]
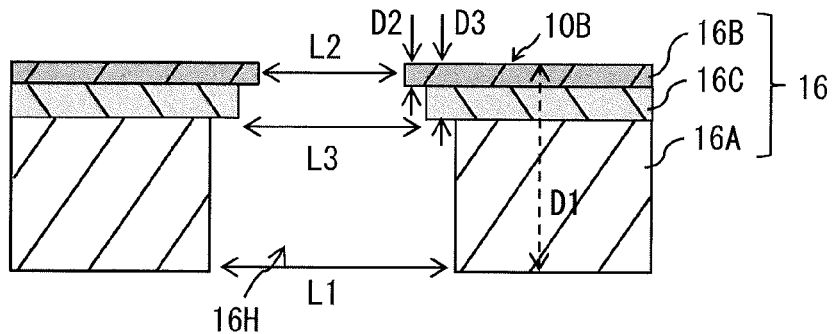
[ FIG. 6B ]
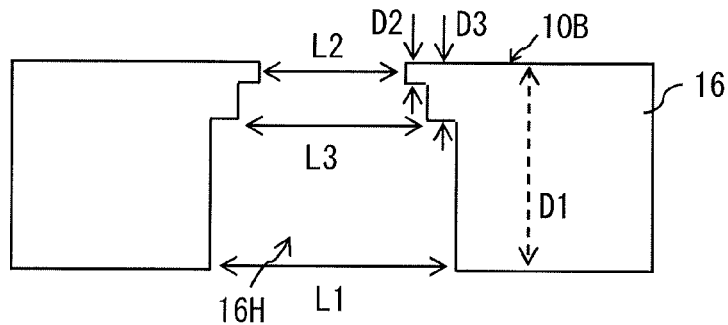
[ FIG. 6C ]
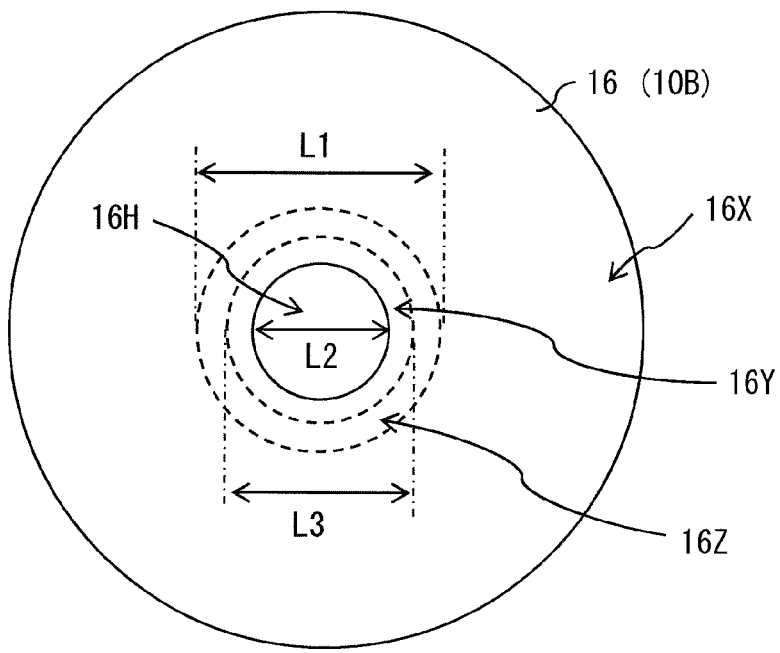

[ FIG. 7A ]
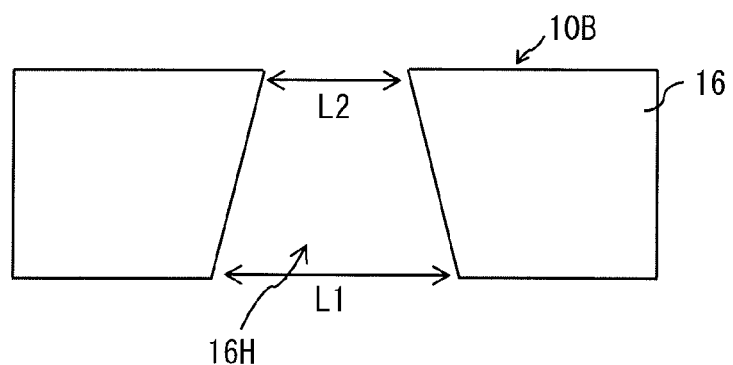
[ FIG. 7B ]
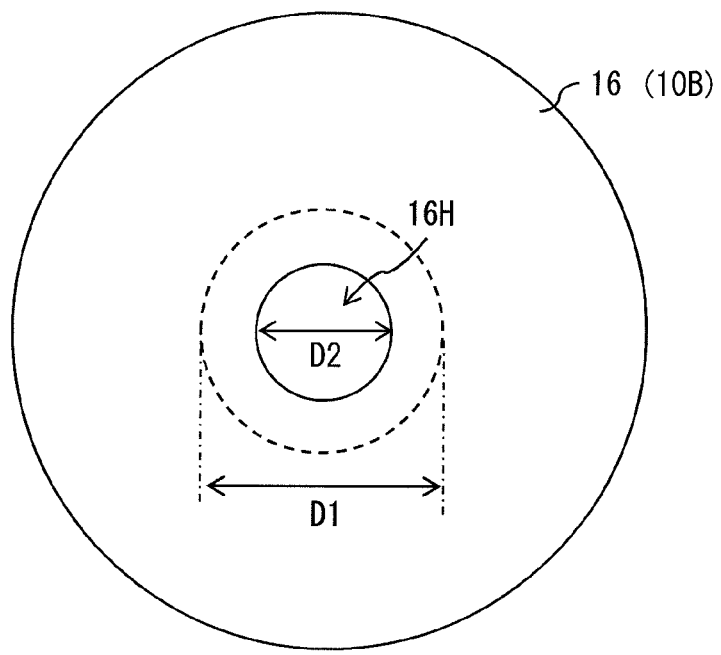

[ FIG. 8 ]
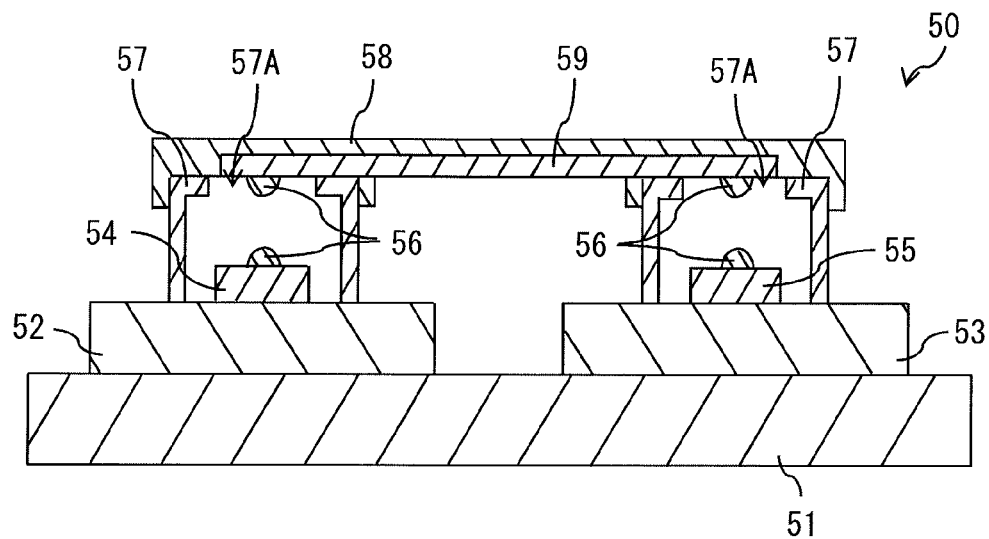
[ FIG. 9 ]
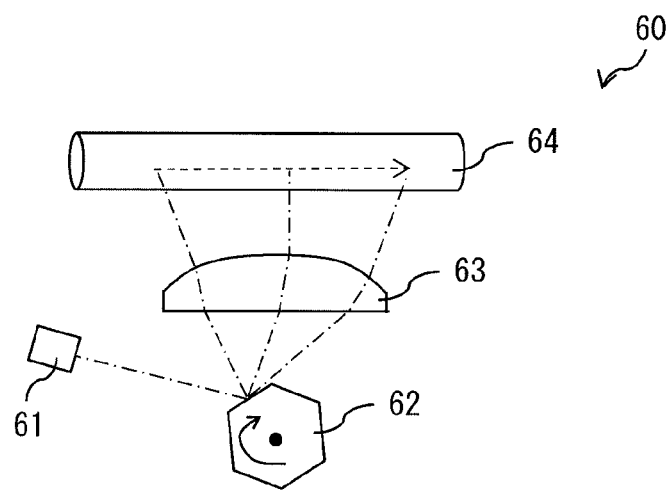

[ FIG. 10 ]
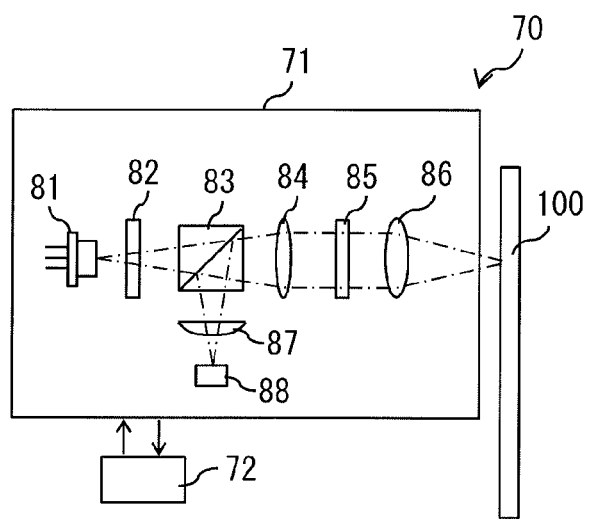

SURFACE-EMITTING LASER AND ELECTRONIC APPARATUS

CROSS-REFERENCE TO RELATED APPLICATIONS

The present application claims the benefit of International Application No. PCT/JP2017/037829, filed Oct. 19, 2017, which claims priority to Japanese Application No. 2016-227977, filed Nov. 24, 2016, the disclosures of which are incorporated herein by reference.

BACKGROUND

The present disclosure relates to a surface-emitting laser and an electronic apparatus including the surface-emitting laser.

In a surface-emitting laser, there have been disclosed various technologies related to current constriction.

SUMMARY

Incidentally, it is desirable that a surface-emitting laser reduce optical loss due to a current constriction region. This is because reduction of the optical loss makes it possible to improve a threshold or luminous efficiency of the surface-emitting laser. Therefore, it is desirable to provide a surface-emitting laser with less optical loss due to the current constriction region and an electronic apparatus including the surface-emitting laser.

A surface-emitting laser according to an embodiment of the present disclosure includes a laminate. The laminate includes an active layer, and a first semiconductor layer and a second semiconductor layer having the active layer interposed therebetween. The surface-emitting laser further includes a current constriction region being formed by impurities and having an opening, the impurities being injected from side of the second semiconductor layer into the laminate; and a first DBR (distributed Bragg reflector) layer on side of the first semiconductor layer and a second DBR layer on side of the second semiconductor layer, the first DBR layer and the second DBR layer having the laminate interposed therebetween at a position facing the opening. At the opening, an opening diameter close to the first DBR layer is larger than an opening diameter close to the second DBR layer.

An electronic apparatus according to an embodiment of the present disclosure includes the surface-emitting laser described above as a light source.

In the surface-emitting laser and the electronic apparatus according to the respective embodiments of the present disclosure, at the opening of the current constriction region, the opening diameter close to the first DBR layer is larger than the opening diameter closer to the second DBR layer. This makes it difficult for the current constriction region to absorb light leaking to an outer side of a current injection region, as compared to a case where the opening diameter of the current constriction region is uniform or a case where the opening diameter of the current constriction region becomes smaller from the second DBR layer side to the first DBR layer side.

In the surface-emitting laser and the electronic apparatus according to the respective embodiments of the present disclosure, it is made difficult for the current constriction region to absorb the light leaking to the outer side of the current injection region, which thus makes it possible to reduce the optical loss due to the current constriction. It is to be noted that effects of the present disclosure are not limited to those described above and may be any of the effects described herein.

BRIEF DESCRIPTION OF DRAWINGS

FIG. 1 is a diagram illustrating an example of a cross-sectional configuration of a surface-emitting laser according to a first embodiment of the present disclosure.

FIG. 2A is a diagram schematically illustrating a current constriction region of FIG. 1.

FIG. 2B is a diagram schematically illustrating the current constriction region of FIG. 2A.

FIG. 2C is a diagram illustrating an example of a top face configuration of the current constriction region of FIG. 2B.

FIG. 3 is a diagram illustrating an example of a cross-sectional configuration of a surface-emitting laser according to a second embodiment of the present disclosure.

FIG. 4 is a diagram illustrating an example of a cross-sectional configuration of a surface-emitting laser according to a third embodiment of the present disclosure.

FIG. 5 is a diagram illustrating an example of a cross-sectional configuration of a surface-emitting laser according to a fourth embodiment of the present disclosure.

FIG. 6A is a diagram illustrating a modification example of a cross-sectional configuration of a current constriction region of FIG. 1, FIG. 3, FIG. 4, and FIG. 5.

FIG. 6B is a diagram schematically illustrating the current constriction region of FIG. 6A.

FIG. 6C is a diagram illustrating an example of a top face configuration of the current constriction region of FIG. 6B.

FIG. 7 is a diagram schematically illustrating a modification example of a cross-sectional configuration of the current constriction region of FIG. 1, FIG. 3, FIG. 4, and FIG. 5.

FIG. 7B is a diagram illustrating an example of a top face configuration of the current constriction region of FIG. 7A.

FIG. 8 is a diagram illustrating an example of a cross-sectional configuration of an optical communication apparatus according to a fifth embodiment of the present disclosure.

FIG. 9 is a diagram illustrating a schematic configuration example of a printer according to a sixth embodiment of the present disclosure.

FIG. 10 is a diagram illustrating a schematic configuration example of an information reproduction and recording apparatus according to a seventh embodiment of the present disclosure.

DETAILED DESCRIPTION

In the following, some embodiments of the disclosure are described in detail with reference to the drawings. The embodiments described below each illustrate a specific example of the present disclosure, and the present disclosure is not limited to the following embodiments. Moreover, the present disclosure is not limited to positions, dimensions, dimension ratios, and other factors of respective components illustrated in the drawings. It is to be noted that description is given in the following order.

1. First Embodiment (Surface-emitting laser)
    An example of forming a first semiconductor layer having a first DBR layer embedded therein, by means of an ELO (Epitaxial Lateral Overgrowth) method
2. Second Embodiment (Surface-emitting laser)

An example of forming the first semiconductor layer on the first DBR layer by means of a general MOCVD (Metal Organic Chemical Vapor Deposition) method 3. Third Embodiment (Surface-emitting laser)

An example of removing a substrate by means of a CMP (Chemical Mechanical Polishing) and then forming the first DBR layer 4. Fourth Embodiment (Surface-emitting laser)

An example of forming the first DBR layer of a concave mirror type

5. Modification Examples common to the respective embodiments (Surface-emitting laser)

Modification Example A: An example of configuring a current constriction region in three impurity regions Modification Example B: An example of configuring the current constriction region in an inverted tapered impurity region 6. Fifth Embodiment (Optical communication apparatus)

An example of using the surface-emitting laser of each of the foregoing embodiments for a light source of an optical communication apparatus 7. Sixth Embodiment (Printer)

An example of using the surface-emitting laser of each of the foregoing embodiments for a light source of a printer 8. Seventh Embodiment (Information reproduction and recording apparatus)

An example of using the surface-emitting laser of each of the foregoing embodiments for a light source of an information reproduction and recording apparatus 1. First Embodiment

[Configuration]

Description is given of a configuration of a surface-emitting laser 10 according to a first embodiment of the present disclosure. FIG. 1 illustrates an example of a cross-sectional configuration of the surface-emitting laser 10.

The surface-emitting laser 10 is a semiconductor laser of a top face emission type suitably applicable as a light source for an optical laser, a laser printer, optical communications, etc. The surface-emitting laser 10 includes a vertical resonator on a substrate 11. The vertical resonator is configured to oscillate at a predetermined oscillation wavelength λ by two DBRs that face each other in a normal direction of the substrate 11. The vertical resonator includes, for example, a laminate 10A and the two DBR layers having the laminate 10A interposed therebetween at a position facing an opening 16H of a current constriction region 16. The foregoing two DBR layers are configured by a first DBR layer 12 on side of a first semiconductor layer 13 described later, and a second DBR layer 18 on side of a second semiconductor layer 15 described later. The first DBR layer 12 is formed closer to the substrate 11 than the second DBR layer 18 is. The laminate 10A includes, for example, an active layer 14 and two semiconductor layers having the active layer 14 interposed therebetween. The two semiconductor layers described above are configured by the first semiconductor layer 13 close to the substrate 11 and the second semiconductor layer 15 away from the substrate 11. The first semiconductor layer 13 is formed closer to the substrate 11 than the second semiconductor layer 15 is.

The surface-emitting laser 10 includes, on the substrate 11, for example, the first DBR layer 12, the first semiconductor layer 13, the active layer 14, the second semiconductor layer 15, a second electrode layer 17A, and the second DBR layer 18 in this order from side of the substrate 11. The surface-emitting laser 10 further includes, for example, a third electrode layer 17B on the second electrode layer 17A, and includes a first electrode layer 19 on a back face of the substrate 11. The laminate 10A may have, for example, on an outermost surface 10B on side of the second DBR layer 18, a contact layer for causing the second semiconductor layer 15 and the second electrode layer 17A to be in ohmic contact with each other. The contact layer may be a layer formed by doping an outermost surface of the second semiconductor layer 15 with a high concentration impurity or may be a layer separately formed from the second semiconductor layer 15 and being in contact with the outermost surface of the second semiconductor layer 15.

The substrate 11 is a crystal growth substrate used in epitaxial crystal growing the first DBR layer 12 and the laminate 10A. That is, the substrate 11 is a substrate provided outside the vertical resonator. Furthermore, in a positional relationship with the vertical resonator, the substrate 11 is a substrate provided on side opposite to light emission of the surface-emitting laser 10. The surface-emitting laser 10 is a nitride semiconductor laser. The substrate 11 is a GaN substrate, for example. The first DBR layer 12 and the laminate 10A are configured by nitride semiconductors. Examples of the nitride semiconductors include GaN, AlGaN, AlInN, GaInN, AlGaInN, etc.

The first DBR layer 12 is configured by a semiconductor multilayer film, for example. The semiconductor multilayer film has a structure in which a low refractive-index layer and a high refractive-index layer are alternately stacked. It is preferable that the low refractive-index layer have a thickness of odd-number times of $\lambda/4n_1$ ($n_1$ is a refractive index of the low refractive-index layer). It is preferable that the high refractive-index layer have the thickness of odd-number times of $\lambda/4n_2$ ($n_2$ is the refractive index of the high refractive-index layer). In the semiconductor multilayer film that configures the first DBR layer 12, combinations of the low reflective-index layer and the high reflective-index layer include, for example, GaN/AlGaN, GaN/AlInN, GaInN/GaN, AlGaN/GaInN, etc. The first semiconductor layer 13 is configured by GaN, for example. The first semiconductor layer 13 is formed with the first DBR layer 12 as a mask, for example, by means of a method of lateral epitaxial growth such as an ELO (Epitaxial Lateral Overgrowth) method. The first semiconductor layer 13 is, for example, a semiconductor layer formed by embedding the first DBR layer 12 therein. The substrate 11, the first DBR layer 12, and the first semiconductor layer 13 include silicon (Si), etc. as n-type impurities. That is, the substrate 11, the first DBR layer 12, and the first semiconductor layer 13 are n-type semiconductor layers. The second semiconductor layer 15 is configured by GaN, for example. The second semiconductor layer 15 includes, for example, magnesium (Mg), zinc (Zn), etc., as p-type impurities. That is, the second semiconductor layer 15 is a p-type semiconductor layer.

The active layer 14 has a quantum well structure, for example. Types of quantum well structures include, for example, a single quantum well structure (QW (Quantum Well) structure) or a multiple quantum well structure (MQW (Multi-Quantum Well) structure). The quantum well structure has a structure in which a well layer and a barrier layer are alternately stacked. Combinations of the well layer and the barrier layer include, for example, $(In_yGa_{(1-y)}N, GaN)$, $(In_yGa_{(1-y)}N, In_zGa_{(1-z)}N)$ [provided that y>z], $(In_yGa_{(1-y)}N, AlGaN)$, etc.

The current constriction region 16 is formed in the laminate 10A. The current constriction region 16 is formed by the impurity injected from the side of the second semiconductor layer 15 into the laminate 10A. The current constriction region 16 includes, as the impurity, one or more of oxygen, boron, chlorine, carbon, fluorine, boron, aluminum, nickel, copper, magnesium, and iron. The current constriction region 16 is configured by a highly resistive region formed by ion implantation into a surface layer of the laminate 10A. The current constriction region 16 is a region to constrict a current injected into the active layer 14. The current constriction region 16 is an annular region including the opening 16H. An inner peripheral surface of the current constriction region 16 has an annular shape, for example. An outer peripheral surface of the current constriction region 16 has the annular shape, an elliptic ring shape, or a polygonal ring shape, for example. In the opening 16H, an opening diameter L1 close to the first DBR layer 12 is larger than an opening diameter L2 close to the second DBR layer 18. The opening diameter L1 is an opening diameter in the neighborhood of a lower end of the current constriction region 16. The neighborhood of the lower end of the current constriction region 16 refers to, for example, a part where the current constriction region 16 and the active layer 14 overlap each other. The opening diameter L2 is the opening diameter on the outermost surface 10B of the laminate 10A, of the current constriction region 16. The opening diameter L1 ranges from 1 μm to 20 μm, for example, and is preferably approximately 10 μm. In the opening 16H, the opening diameter L1 is larger than the opening diameter L2 by λ/n or more (λ represents the oscillation wavelength and n represents the refractive index of the laminate 10A). In the opening 16H, it is preferable that the opening diameter L1 be larger than the opening diameter L2 by 2 μm or larger. The current constriction region 16 has a depth that reaches the active layer 14, for example, at the deepest point in the opening 16H. The current constriction region 16 has the depth of approximately 100 nm, for example, at the deepest point in the opening 16H. The current constriction region 16 has the depth of approximately 3 nm, for example, at a point close to the outermost surface 10B of the laminate 10A and close to an inner surface of the opening 16H.

The depth of the current constriction region 16 represents the depth from the outermost surface 10B of the laminate 10A to the lower end of the current constriction region 16. The lower end of the current constriction region 16 is a part (hereinafter referred to as a "corresponding part") in the current constriction region 16 having an impurity concentration that is $1/100$ of the impurity concentration at a part where the concentration of the impurities distributed in the current constriction region 16 is highest. The lower end of the current constriction region 16 is measurable by, for example, secondary ion mass spectrometry (SIMS: Secondary Ion Mass Spectrometry), energy dispersive X-ray (EDX: Energy Dispersive X-ray) spectroscopy, etc. It is to be noted that impurity concentration distribution in a depth direction in the current constriction region 16 is often a monotonic decrease from the outermost surface 10B of the laminate 10A. The monotonic decrease includes, for example, an exponential decrease, a linear decrease, a stepwise decrease, etc. The monotonic decrease is not limited to the exponential decrease, the linear decrease, or the stepwise decrease. However, the impurity concentration distribution in the depth direction in the current constriction region 16 may have a peak at a predetermined depth. In this case, it is possible that there are the two foregoing corresponding parts. In that case, a deeper part is the lower end of the current constriction region 16. If two or more types of impurities are distributed in the current constriction region 16, the depth of the current constriction region 16 is specified for each of the impurities.

The opening diameter of the opening 16H is a length of a line segment that passes through the center of the current constriction region 16 in a plane having a central axis of the current constriction region 16 as a normal line, and both ends of the line segment are in contact with the inner surface of the opening 16H. The inner surface of the opening 16H is the part in the current constriction region 16 having the impurity concentration that is $1/100$ of the impurity concentration at a part where the concentration of the impurities distributed in the outermost surface 10B of the current constriction region 16 is highest. The inner surface of the opening 16H is measurable by, for example, SIMS or EDX, etc. It is to be noted that the impurity concentration distribution in a lateral direction in the current constriction region 16 is generally uniform. However, in a boundary from a region including the impurity to a region including no impurity, the impurity concentration distribution often exhibits the monotonic decrease. If two or more impurities are distributed in the current constriction region 16, the inner surface of the opening 16H is specified for each of the impurities.

FIG. 2A illustrates an example of a cross-sectional configuration of the current constriction region 16. FIG. 2B schematically illustrates the current constriction region 16 of FIG. 2A. FIG. 2C illustrates an example of a top face configuration of the current constriction region 16 of FIG. 2B. The current constriction region 16 includes, for example, an impurity region 16A and an impurity region 16B that are concentrically annular-shaped and differ in depth and opening diameter from each other. Alternatively, the current constriction region 16 is configured by, for example, the impurity region 16A and the impurity region 16B that are concentrically annular-shaped and differ in depth and opening diameter from each other. Moreover, the impurities forming the impurity region 16A and the impurities forming the impurity region 16B differ from each other. The impurity region 16A includes boron or chlorine, for example, as the impurity. The impurity region 16B includes oxygen, for example, as the impurity. If the impurity region 16B includes oxygen as the impurity, the impurity region 16B is formable by means of an ashing apparatus, for example. If the impurity region 16B includes chlorine as the impurity, the impurity region 16B is formable by means of an RIE (reactive ion etching) apparatus, for example.

A depth D1 of the impurity region 16A is deeper than a depth D2 of the impurity region 16B. Furthermore, the opening diameter L1 of the impurity region 16A is larger than the opening diameter L2 of the impurity region 16B. That is, the opening diameter L1 of the impurity region 16A having a relatively deep depth is larger than the opening diameter L2 of the impurity region 16B having a relatively shallow depth. At this time, the opening diameter of the opening 16H intermittently increases from the second DBR layer 18 side toward the first DBR layer 12 side, for example.

At this time, the depth D1 of the impurity region 16A is the depth from the outermost surface 10B of the laminate 10A to the lower end of the impurity region 16A. That is, the impurity region 16A is distributed from the outermost surface 10B of the laminate 10A to the lower end of the impurity region 16A. The lower end of the impurity region 16A is a part in the impurity region 16A having the impurity concentration that is $1/100$ of the impurity concentration at a part where the concentration of the impurities distributed in the impurity region 16A is highest. The depth D2 of the impurity region 16B is the depth from the outermost surface 10B of the laminate 10A to the lower end of the impurity region 16B. That is, the impurity region 16B is distributed from the outermost surface 10B of the laminate 10A to the lower end of the impurity region 16B. The lower end of the impurity region 16B is a part in the impurity region 16B having the impurity concentration that is 1/100 of the impurity concentration at a part where the concentration of the impurities distributed in the impurity region 16B is highest.

In addition, the opening diameter L1 of the impurity region 16A is the length of the line segment that passes through the center of the current constriction region 16 in the plane having the central axis of the current constriction region 16 as the normal line, and both ends of the line segment are in contact with the inner surface of the impurity region 16A. The inner surface of the impurity region 16A is a part in the current constriction region 16A having the impurity concentration that is 1/100 of the impurity concentration at a part where the concentration of the impurities distributed on the outermost surface 10B of the current constriction region 16B is highest. The opening diameter L2 of the impurity region 16B is the length of the line segment that passes through the center of the current constriction region 16 in the plane having the central axis of the current constriction region 16 as the normal line, and both ends of the line segment are in contact with the inner surface of the impurity region 16B. The inner surface of the impurity region 16B is a part in the current constriction region 16B having the impurity concentration that is 1/100 of the impurity concentration at a part where the concentration of the impurities distributed on the outermost surface 10B in the current constriction region 16 is highest.

The current constriction region 16 is presented as in FIG. 2B, for example, using the depth D1 and the depth D2 and the opening diameter L1 and the opening diameter L2, which are determined as described above. At this time, it may be interpreted that, as illustrated in FIG. 2B and FIG. 2C, for example, the current constriction region 16 includes an impurity region 16X and an impurity region 16Y that are concentrically annular-shaped and differ in depth and opening diameter from each other. It may also be interpreted that, as illustrated in FIG. 2B and FIG. 2C, for example, the current constriction region 16 is configured by the impurity region 16X and the impurity region 16Y that are concentrically annular-shaped and differ in depth and opening diameter from each other.

The depth of the impurity region 16X is deeper than the depth of the impurity region 16Y. Furthermore, the opening diameter L1 of the impurity region 16X is larger than the opening diameter L2 of the impurity region 16Y. The opening diameter L1 of the impurity region 16X having a relatively deep depth is larger than the opening diameter L2 of the impurity region 16Y having a relatively shallow depth. At this time, the opening diameter of the opening 16H intermittently increases from the second DBR layer 18 side toward the first DBR layer 12 side, for example.

The impurity region 16X includes the impurity forming the impurity region 16A and the impurity forming the impurity region 16B. On the one hand, the impurity region 16Y includes the impurity forming the impurity region 16B and little impurity forming the impurity region 16A.

The second electrode layer 17A is in contact with the outermost surface 10B of the laminate 10A on the second DBR layer 18. The second electrode layer 17A is in contact with the entire region that faces at least the second DBR layer 18, of the outermost surface 10B. That is, no current constriction region due to $SiO_2$, etc. is present between the outermost surface 10B and the second DBR layer 18.

The second electrode layer 17A is configured by a conductive material having optical transparency to light of the oscillation wavelength $\lambda$ (the optical transparency has absorptivity of 5% or lower, for example). Examples of the foregoing conductive materials include indium-tin oxide (including ITO, Indium Tin Oxide, Sn-doped $In_2O_3$, crystalline ITO, and amorphous ITO), indium-zinc oxide (IZO, Indium Zinc Oxide), IFO (F-doped $In_2O_3$), tin oxide ($SnO_2$), ATO (Sb-doped $SnO_2$), FTO (F-doped $SnO_2$), zinc oxide (ZnO, including Al-doped ZnO and B-doped ZnO), InGaZnO-based material ($InGaZnO_4$, etc. which may also be referred to as "IGZO"), and ITiO (Ti-doped ITO). The second electrode layer 17A may be a semiconductor layer having a specific conductivity type, and may be an n-type GaN layer doped with Si, for example.

The third electrode layer 17B is configured by a single-layer film or a multilayer film including one or more types of metals (including alloys) selected from a group consisting of, for example, gold (Au), silver (Ag), palladium (Pd), platinum (Pt), nickel (Ni), titanium (Ti), vanadium (V), tungsten (W), chromium (Cr), aluminum (Al), copper (Cu), zinc (Zn), tin (Sn), and indium (In).

The second DBR layer 18 is configured by a dielectric multilayer, for example. The dielectric multilayer has a structure in which the low refractive-index layer and the high refractive-index layer of thickness are alternately stacked. It is preferable that the low refractive-index layer have the thickness of odd-number times of $\lambda/4n_3$ ($n_3$ is the refractive index of the low refractive-index layer). It is preferable that the high refractive-index layer have the thickness of odd-number times of $\lambda/4n_4$ ($n_4$ is the refractive index of the high refractive-index layer). Examples of materials of the dielectric multilayer that configures the second DBR layer 18 include $SiO_2$, SiN, $Al_2O_3$, $Nb_2O_5$, $Ta_2O_5$, $TiO_2$, AlN, MgO, and $ZrO_2$. In the dielectric multilayer that configures the second DBR layer 18, the combinations of the low refractive-index layers and the high refractive-index layers include, for example, $SiO_2$/SiN, $SiO_2$/$Nb_2O_5$, $SiO_2$/$ZrO_2$, and $SiO_2$/AlN. The dielectric multilayer that configures the second DBR layer 18 is formed by a film formation method such as sputtering, the CVD, or vapor deposition, etc.

The first electrode layer 19 has a structure (Ti/Pt/Au) in which, for example, titanium (Ti), platinum (Pt), and gold (Au) are stacked from the side of the substrate 11 in this order. The first electrode layer 19 may also have a structure (V/Pt/Au) in which, for example, vanadium (V), platinum (Pt), and gold (Au) are stacked from the side of the substrate 11 in this order. The first electrode layer 19 may have a structure (Ti/Al/Au) in which, for example, titanium (Ti), aluminum (Al), and gold (Au) are stacked from the side of the substrate 11 in this order.

[Method of Manufacturing]

In the following, description is given of an example of a manufacturing method of the surface-emitting laser 10 according to the present embodiment. In order to manufacture the surface-emitting laser 10, the nitride semiconductors are collectively formed on the substrate 11, for example, by means of an epitaxial crystal growth method such as an MOCVD (Metal Organic Chemical Vapor Deposition: organometallic vapor-phase growth) or an ELO method. Upon this, for raw materials of compound semiconductors, for example, trimethylgallium $(CH_3)_3Ga$), for example, is used as raw gas of Ga, trimethylaluminum $((CH_3)_3Al)$, for example, is used as the raw gas of Al, and trimethylindium $((CH_3)_3In)$, for example, is used as the raw gas of In. In addition, ammonia ($NH_3$) is used as the raw gas of N.

First, the first DBR layer 12 is formed on the substrate 11. The first DBR layer 12 is formed by forming a multilayer film reflecting mirror on an entire top face of the substrate 11 by means of the MOCVD method, for example, and then selectively etching. At this time, an exposed surface of the substrate 11 is formed in a periphery of the first DBR layer 12. Thereafter, with the first DBR layer 12 as the mask, the first semiconductor layer 13 in which the first DBR layer 12 is embedded is formed by using the method of epitaxially growing in the lateral direction such as an ELO method, etc. Subsequently, the active layer 14 and the second semiconductor layer 15 are formed on the first semiconductor layer 13 in this order, by means of the MOCVD method, for example. This forms the laminate 10A.

Subsequently, for example, a circular pattern having a diameter equal to the opening diameter L1 is formed at a position facing the first DBR layer 12, of the outermost surface 10B of the laminate 10A. Thereafter, with the foregoing pattern as the mask, predetermined impurities are injected to a predetermined depth from the outermost surface 10B of the laminate 10A, for example, by means of the ion implantation method. This forms the impurity region 16A having the opening with the opening diameter L1. Thereafter, after the foregoing pattern is removed, the circular pattern having the diameter equal to the opening diameter L2, for example, is formed at a position facing the opening of the impurity region 16A, of the outermost surface 10B of the laminate 10A. Thereafter, with the foregoing pattern as the mask, the predetermined impurities are injected from the outermost surface 10B of the laminate 10A to the predetermined depth by means of the ion implantation method, for example. This forms the impurity region 16B having the opening with the opening diameter L2. In this manner, the current constriction region 16 including the impurity region 16A and the impurity region 16B is formed.

Subsequently, the second electrode layer 17A is formed so as to be in contact with the entire outermost surface 10B of the laminate 10A, for example. Thereafter, the second DBR layer 18 is formed by forming the dielectric multilayer film reflecting mirror on the entire top face of the second electrode layer 17A by means of, for example, the sputtering, the CVD, or the vapor deposition, and then selectively etching. At this time, an exposed surface of the second electrode layer 17A is formed in a periphery of the second DBR layer 18. Then, the third electrode layer 17B is formed on the exposed surface of the second electrode layer 17A.

Subsequently, the substrate 11 is thinned by polishing the back face of the substrate 11, as necessary. For a polishing method at this time, it is possible to use, for example, mechanical grinding, chemical mechanical polishing, or photoelectrochemical etching, etc. Thereafter, the first electronic layer 19 is formed on the back face of the substrate 11. In this manner, the surface-emitting laser 10 according to the present embodiment is manufactured.

[Operation]

In the surface-emitting laser 10 of such a configuration, in a case where a predetermined voltage is applied between the third electrode layer 17B and the first electrode layer 19, the current is injected into the active layer 14 through the opening 16H. This results in light emission due to recombination of an electron and a hole. The light is reflected by a pair of the first DBR layer 12 and the second DBR layer 18, and laser oscillation occurs at a predetermined oscillation wavelength 2. Then, a laser beam of the oscillation wavelength 2 is emitted from the top face of the second DBR layer 18 to outside.

[Effects]

In the following, description is given of effects of the surface-emitting laser 10 according to the present embodiment.

In an existing widespread GaAs-based surface-emitting laser, the current construction structure is formed by laterally oxidizing an AlAs layer formed in the vicinity of an active layer to form a non-energized region in a device, thereby concentrating the current on one spot. However, such a technology has not been established for a nitride due to material restrictions, and thus another way of building the current constriction structure has been explored.

For example, it is possible to achieve the current constriction structure by partially inserting $SiO_2$ between an ITO electrode and p-GaN to form the non-energized region. However, this method forms a long resonator distribution in a resonator, which thus may possibly cause strong optical loss due to anti-guide guided wave, i.e., diffraction. In order to solve such a problem, forming the current constriction structure by the ion implantation is possible. For example, forming the non-energized region by the ion implantation of boron ions is possible. This method prevents formation of the long resonator distribution in the resonator, thus causing no optical loss due to the diffraction, similarly to a case where $SiO_2$ is used.

However, with this method, the light leaking to the outer side of the current injection region is absorbed by the implanted ion or into a special electron state caused by the ion implantation, thus causing the optical loss and deteriorating a threshold or efficiency of the device. In a case where the boron ions are implanted up to under the active layer, distribution of the boron ions is spatially widely spread to a resonator direction, thus causing greater optical loss. Moreover, as a result of the boron ions being implanted into the active layer, defective non-emission recombination introduced into the active layer generates a reactive current and degrades characteristics of the device.

Incidentally, in the ion implantation, it is possible to adjust a depth of entry into a semiconductor device by changing an acceleration voltage during ion irradiation. Therefore, it is possible to reduce an amount of optical loss within the resonator by shallowly implanting ions. In such a case, however, a region to be made highly resistive becomes thinner, a discrete current leak occurs with a remaining defect in an outermost layer as an origin, thus making it difficult to form a high-quality current constriction structure.

On the one hand, in the present embodiment, in the opening 16H of the current constriction region 16, the opening diameter L1 close to the first DBR layer 12 is larger than the opening diameter L2 close to the second DBR layer 18. This makes it difficult for the current constriction region 16 to absorb light leaking to the outer side of the current injection region, as compared to a case where the opening diameter of the current constriction region 16 is uniform or a case where the opening diameter of the current constriction region 16 becomes smaller from the second DBR layer 18 side toward the first DBR layer 12 side As a result, it is possible to reduce the optical loss due to the current constriction. Therefore, it is possible to improve the threshold or the luminous efficiency of the surface-emitting laser 10.

In addition, in the present embodiment, in the opening 16H, the opening diameter L1 is larger than the opening diameter L2 by $\lambda/n$ or more. This makes it difficult for the current constriction region 16 to absorb the light leaking to the outer side of the current injection region. As a result, it is possible to reduce the optical loss due to the current constriction. Therefore, it is possible to improve the threshold or the luminous efficiency of the surface-emitting laser 10.

In addition, in the present embodiment, the current constriction region 16 includes the impurity region 16A and the impurity region 16B that are concentrically annular-shaped and differ in depth and opening diameter from each other. Alternatively, the current constriction region 16 includes the impurity region 16X and the impurity region 16Y that are concentrically annular-shaped and differ in depth and opening diameter from each other. At this time, the depth D1 of the impurity region 16A (or the impurity region 16X) is deeper than the depth D2 of the impurity region 16B (or the impurity region 16Y). Furthermore, the opening diameter L1 of the impurity region 16A (or the impurity region 16X) is larger than the opening diameter L2 of the impurity region 16B (or the impurity region 16Y). This makes it difficult for the current constriction region 16 to absorb the light leaking to the outer side of the current injection region. Moreover, this makes it difficult for a current leak to occur in the current constriction region 16. As a result, it is possible to reduce the current leak and the optical loss due to the current constriction. Therefore, it is possible to improve the threshold or the luminous efficiency of the surface-emitting laser 10.

In addition, in the present embodiment, the current constriction region 16 is configured by the impurity region 16A and the impurity region 16B that are concentrically annular-shaped and differ in depth and opening diameter from each other. Alternatively, the current constriction region 16 is configured by the impurity region 16X and the impurity region 16Y that are concentrically annular-shaped and differ in depth and opening diameter from each other. At this time, the opening diameter L1 of the impurity region 16A (or the impurity region 16X) having a relatively deep depth is larger than the opening diameter L2 of the impurity region 16B (or the impurity region 16Y) having a relatively shallow depth. This makes it difficult for the current constriction region 16 to absorb the light leaking to the outer side of the current injection region. Moreover, this makes it difficult for the current leak to occur in the current constriction region 16. As a result, it is possible to reduce the current leak and the optical loss due to the current constriction simultaneously. Therefore, it is possible to improve the threshold or the luminous efficiency of the surface-emitting laser 10.

In addition, in the present embodiment, the opening diameter of the opening 16H intermittently increases from the second DBR layer 18 side toward the first DBR layer 12 side. This makes it difficult for the current constriction region 16 to absorb the light leaking to the outer side of the current injection region. As a result, it is possible to reduce the optical loss due to the current constriction. Therefore, it is possible to improve the threshold or the luminous efficiency of the surface-emitting laser 10.

In addition, in the present embodiment, the impurities forming the impurity region 16A and those forming the impurity region 16B differ from each other. This makes it possible to select the impurities that are easily injectable deeply into the laminate 10A as the impurities forming the impurity region 16A. Furthermore, this makes it possible to select the impurities that are easily injectable shallowly into the laminate 10A as the impurities forming the impurity region 16B. As a result, it is possible to effectively make the current constriction region 16 highly resistive, thus allowing for reduction of the current leak in the current constriction region 16. Therefore, it is possible to improve the threshold or the luminous efficiency of the surface-emitting laser 10.

In addition, in the present embodiment, the current constriction region 16 is formed for the laminate 10A configured by the nitride semiconductors. Furthermore, the current constriction region 16 includes, as the impurities, one or more of oxygen, boron, chlorine, carbon, fluorine, boron, aluminum, nickel, copper, magnesium, and iron. This makes it possible to select the impurities that are easily injectable deeply into the laminate 10A as the impurities forming the impurity region 16A. Furthermore, this makes it possible to select the impurities that are easily injectable shallowly into the laminate 10A as the impurities forming the impurity region 16B. As a result, it is possible to effectively make the current constriction region 16 highly resistive, thus allowing for the reduction of the current leak in the current constriction region 16. Therefore, it is possible to improve the threshold or the luminous efficiency of the surface-emitting laser 10.

In addition, in the present embodiment, the second electrode layer 17A is in contact with the entire region of the outermost surface 10B that faces at least the second DBR layer 18, and no current constriction structure by $SiO_2$, etc. is not present between the outermost surface 10B and the second DBR layer 18. This prevents formation of the longer resonator distribution in the resonator, thus making it possible to eliminate the optical loss due to the diffraction, like the case where $SiO_2$ is used. Therefore, it is possible to improve the threshold or the luminous efficiency of the surface-emitting laser 10.

2. Second Embodiment

In the following, description is given of a surface-emitting laser 20 according to a second embodiment of the present disclosure. FIG. 3 illustrates an example of a cross-sectional configuration of the surface-emitting laser 20. The surface-emitting laser 20 includes a first DBR layer 22 instead of the first DBR layer 12 in the surface-emitting laser 10 of the foregoing embodiment and a first semiconductor layer 23 instead of the first semiconductor layer 13. Therefore, in the surface-emitting laser 20, instead of the first semiconductor layer 13, a laminate 20A including the first semiconductor layer 23 instead of the first semiconductor layer 13 is provided, and furthermore, an outermost surface 20B is provided instead of the outermost surface 10B.

The first DBR layer 22 has an identical configuration to the first DBR layer 12, except that the first DBR layer 22 is not shaped like an island as the first DBR layer 12 is. The first semiconductor layer 23 is not formed by the ELO method but by a general MOCVD method. That is, the first semiconductor layer 23 does not have the first DBR layer 22 embedded therein, but is a semiconductor layer stacked on the first DBR layer 22.

In the present embodiment, the current constriction region 16 has the depth (depth of approximately 50 nm, for example) that is not enough to reach the active layer 14. At this time, the depth of the impurity region 16B is deeper than, for example, the depth in the first embodiment (approximately 3 nm, for example), and is approximately 10 nm, for example. It is to be noted that in the present embodiment, the current constriction region 16 may have the depth enough to reach the active layer 14. In addition, in the present embodiment, the substrate 11 is a GaN substrate having an m75 surface [2, 0, −2, 1] as a principal surface.

As described above, the surface-emitting laser 20 includes the current constriction region 16 that is equivalent to the current constriction region 16 in the surface-emitting laser 10 of the foregoing first embodiment. Therefore, in the present embodiment, it is possible to have similar effects to those of the foregoing first embodiment.

3. Third Embodiment

In the following, description is given of a surface-emitting laser 30 according to a third embodiment of the present disclosure. FIG. 4 illustrates an example of a cross-sectional configuration of the surface-emitting laser 30. The surface-emitting laser 30 is obtained by forming the first semiconductor layer 23, etc., without forming the first DBR layer 22 in the surface-emitting laser 20 of the foregoing second embodiment, then, removing the substrate 11 to expose the back face of the first DBR layer 22, and providing the first semiconductor layer 23 and a first electrode layer 39 that are in contact with the back face. The surface-emitting laser 30 further includes a support substrate 34 that supports the laminate 20A via a solder layer 33, the solder layer covering the second DBR layer 18 and the third electrode layer 17B in the surface-emitting laser 20 of the foregoing second embodiment. That is, the surface-emitting laser 30 is a semiconductor laser of a back face emission type that emits light of the oscillation wavelength of k from side of the first DBR layer 22.

The surface-emitting laser 30 includes the current constriction region 16 that is equivalent to the current constriction region 16 in the surface-emitting laser 20 of the foregoing second embodiment. Therefore, in the present embodiment, it is possible to have similar effects to those of the foregoing second embodiment.

4. Fourth Embodiment

In the following, description is given of a surface-emitting laser 40 according to a fourth embodiment of the present disclosure. FIG. 5 illustrates an example of a cross-sectional configuration of the surface-emitting laser 40. The surface-emitting laser 40 includes a first semiconductor layer 41 instead of the first semiconductor layer 23 in the surface-emitting laser 30 of the foregoing third embodiment, the first semiconductor layer 41 having a convex portion 41A on the back face, and a first DBR layer 42 instead of the first DBR layer 22. Although it is preferable that the current constriction region 16 have the depth enough to reach the active layer 14, the current constriction region 16 may have the depth not enough to reach the active layer 14. The solder layer 33 and the support substrate 34 may be omitted or provided.

The first semiconductor layer 41 has an identical configuration to the first semiconductor layer 23, except that the first semiconductor layer 41 has the convex portion 41A on the back face. The convex portion 41A is disposed at a position facing the opening 16H of the current constriction region 16. The first DBR layer 42 is configured by a convex lens-shaped dielectric multilayer film reflecting mirror. The first DBR layer 42 is formed to be in contact with the convex portion 41A and is convex shaped by forming the dielectric multilayer film reflecting mirror on the convex portion 41A. Therefore, the first DBR layer 42 acts as a concave mirror to light emitted from the active layer 14. This allows the first DBR layer 42 to compensate for the diffraction of the light emitted from the active layer 14 and suppress the diffraction loss.

The surface-emitting laser 40 includes the current constriction region 16 that is equivalent to the current constriction region 16 in the surface-emitting laser 30 of the foregoing third embodiment. Therefore, in the present embodiment, it is possible to have similar effects to those of the foregoing third embodiment.

5. Modification Examples Common to Respective Embodiments

In the following, description is given of modification examples common to the foregoing first to fourth embodiments.

Modification Example A

FIG. 6 illustrates a modification example of the cross-sectional configuration of the current constriction region of FIG. 1, FIG. 3, FIG. 4, and FIG. 5. FIG. 6B schematically illustrates the current constriction region 16 of FIG. 6A. FIG. 6C illustrates an example of a top face configuration of the current constriction region 16 of FIG. 6B.

In the foregoing first to fourth embodiments, the current constriction region 16 may have a plurality of impurity regions that is concentrically annular-shaped and differs in depth and opening diameter from each other. Alternatively, in the foregoing first to fourth embodiments, the current constriction region 16 may be configured by the plurality of impurity regions shaped like the concentric ring and having the different depth and opening diameter from each other. The current constriction region 16 further has an impurity region 16C, in addition to the impurity region 16A and the impurity region 16B, for example. The impurity region 16C has an opening diameter L3 that is smaller than the opening diameter L1 and larger than the opening diameter L2. The impurity region 16C has a depth D3 that is shallower than the depth D1 and deeper than the depth D2.

The current constriction region 16 is presented as in FIG. 6B, for example, using the depth D1, the depth D2, and the depth D3 and the opening diameter L1, the opening diameter L2, and the opening diameter L3. At this time, it may be interpreted that, as illustrated in FIG. 6B and FIG. 6C, for example, the current constriction region 16 includes the impurity regions 16X, 16Y, and 16Z that are concentric annular-shaped and differ in depth and opening diameter from one another. It may also be interpreted that, as illustrated in FIG. 6B and FIG. 6C, for example, the current constriction region 16 is configured by the impurity regions 16X, 16Y, and 16Z that are concentric annular-shaped and differ in depth and opening diameter from one another.

In this modification example, the current constriction region 16 includes the impurity regions 16A, 16B, and 16C that are concentric annular-shaped and differ in depth and opening diameter from one another. Alternatively, the current constriction region 16 includes the impurity regions 16X, 16Y, and 16Z that are concentric annular-shaped and differ in depth and opening diameter from one another. At this time, the depth D1 of the impurity region 16A (or the impurity region 16X) is deeper than the depth D3 of the impurity region 16C (or the impurity region 16Z), and the depth D3 of the impurity region 16C (or the impurity region 16Z) is deeper than the depth D2 of the impurity region 16B (or the impurity region 16Y). Furthermore, the opening diameter L1 of the impurity region 16A (or the impurity region 16X) is larger than the opening diameter L3 of the impurity region 16C (or the impurity region 16Z), and the opening diameter L3 of the impurity region 16C (or the impurity region 16Z) is larger than the opening diameter L2 of the impurity region 16B (or the impurity region 16Y). This makes it difficult for the current constriction region 16 to absorb the light leaking to the outer side of the current injection region. Moreover, this makes it difficult for the current leak to occur in the current constriction region 16. As a result, it is possible to reduce the current leak and the optical loss due to the current constriction.

In addition, in this modification example, the current constriction region 16 is configured by the impurity regions 16A, 16B, and 16C that are concentric annular-shaped and differ in depth and opening diameter from one another. Alternatively, the current constriction region 16 is configured by the impurity regions 16X, 16Y, and 16Z that are concentric annular-shaped and differ in depth and opening diameter from one another. At this time, the opening diameter L1 of the impurity region 16A (or the impurity region 16X) having a relatively deep depth is larger than the opening diameter L3 of the impurity region 16C (or the impurity region 16Z) having a relatively shallow depth. Furthermore, the opening diameter L3 of the impurity region 16C (or the impurity region 16Z) having a relatively deep depth is larger than the opening diameter L2 of the impurity region 16B (or the impurity region 16Y) having a relatively shallow depth. This makes it difficult for the current constriction region 16 to absorb the light leaking to the outer side of the current injection region. Moreover, this makes it difficult for the current leak to occur in the current constriction region 16. As a result, it is possible to reduce the current leak and the optical loss due to the current constriction.

Modification Example B

FIG. 7A schematically illustrates a modification example of a cross-sectional configuration of the current constriction region 16 of FIG. 1, FIG. 3, FIG. 4, and FIG. 5. FIG. 7B illustrates an example of a top face configuration of the current constriction region 16 of FIG. 7A.

In this modification example, the current constriction region 16 is the impurity region formed by a single impurity. The current constriction region 16 is the annular region having the opening 16H. In the opening 16H, the opening diameter L1 close to the first DBR layer 12 is larger than the opening diameter L2 close to the second DBR layer 18. The opening diameter of the opening 16H continuously increases from the second DBR layer 18 side toward the first DBR layer 12 side, for example.

This modification example includes the current constriction region 16B that has workings and effects equivalent to the current constriction region 16 in the surface-emitting laser 10 of the foregoing first embodiment. Therefore, in this modification example, it is possible to achieve the effects similar to those of the foregoing first embodiment.

Modification Example C

In the foregoing respective embodiments and the modification examples thereof, the surface-emitting lasers 10 to 40 may be a GaAs-based or InP-based semiconductor laser. In this case, examples of the impurities forming the current constriction region 16 include hydrogen, boron, oxygen, chromium, carbon, fluorine, aluminum, nickel, copper, magnesium, iron, etc. Therefore, in this modification example, it is possible to achieve the effects similar to those of the foregoing first embodiment.

This modification example includes the current constriction region 16 that has the workings and effects equivalent to those of the current constriction region 16 in the surface-emitting lasers 10 to 40 according to the foregoing respective embodiments and the modification examples thereof.

6. Fifth Embodiment

[Configuration]

In the following, description is given of an optical communication apparatus 50 according to a fifth embodiment of the present disclosure. FIG. 8 illustrates an example of a cross-sectional configuration of the optical communication apparatus 50. The optical communication apparatus 50 has two LSI chips 52 and 53 mounted on a printed wiring substrate 51. A light-emitting device 54 is disposed on a surface of the one LSI chip 52. The light-emitting device 54 is any of the surface-emitting lasers 10 to 40 according to the foregoing respective embodiments and the modification examples thereof. An electrical signal from the LSI chip 52 is converted into an optical signal by the light-emitting device 54 and the optical signal is outputted from the light-emitting device 54. A light-receiving device 55 such as a photodiode is disposed on a surface of the other LSI chip 53. The optical signal inputted to the light-receiving device 55 is converted into the electrical signal by the light-receiving device 55 and the electrical signal is inputted to the LSI chip 53.

Respective lenses 56 are provided on a light-emitting surface of the light-emitting device 54, the light-emitting surface of the light-receiving device 55, and both ends of an optical waveguide 59. The lens 56 is, for example, a collimating lens that collimates divergent light and collects the parallel light. In addition, on the top faces of the LSI chips 52 and 53 is provided a cylinder-shaped male-type connector 57 that covers the light-emitting device 54 or the light-receiving device 55. An opening 57A is provided on the top face of the male-type connector 57, and a female-type connector 58 that blocks the opening 57A and mates with the male-type connector 57 is provided. The female-type connector 58 is provided along the optical waveguide 59 and also has a function to support the optical waveguide 59.

In the present embodiment, in a case where the light-emitting device 54 is driven after the male-type connector 57 and the female-type connector 58 are coupled to each other, light is emitted from the light-emitting device 54, and the light enters one end of the optical waveguide 59 via the lens 56. After the light entering the optical waveguide 59 is guided through the optical waveguide 59, the light is outputted from the other end of the optical waveguide 59 and enters the light-receiving device 55 via the lens 56. After the light entering the light-receiving device 55 is converted into the electrical signal (photocurrent) in accordance with an output level of the inputted light, the electrical signal is outputted to the LSI chip 53.

Incidentally, in the present embodiment, any of the surface-emitting lasers 10 to 40 according to the foregoing respective embodiments and the modification examples thereof is used for the optical communication apparatus 50. This allows the light-emitting device 54 to operate with high output or low consumed power.

In the present embodiment, the optical communication apparatus 50 may include a plurality of the light-emitting devices 54. In addition, in the present embodiment, the optical communication apparatus 50 may include a plurality of the light-receiving devices 55.

7. Sixth Embodiment

[Configuration]

In the following, description is given of a printer 60 according to a sixth embodiment of the present disclosure.

FIG. 9 illustrates an example of a schematic configuration of the printer 60. The printer 60 includes, for example, a light source 61, a polygon mirror 62 that reflects light from the light source 61 and scans the reflected light, a fθ lens 63 that guides the light from the polygon mirror 62 to a photoconductive drum 64, the photoconductive drum 64 that forms an electrostatic latent image in response to the light from the fθ lens 63, and a toner supplier (unillustrated) that causes toner to be attached to the photoconductive drum 64 in accordance with the electrostatic latent image.

Any of the surface-emitting lasers 10 to 40 according to the foregoing respective embodiments and the modification examples thereof is used as the light source 61 in the printer 60. This allows the light source 61 to operate with high output or low consumed power.

8. Seventh Embodiment

[Configuration]

In the following, description is given of an information reproduction and recording apparatus 70 according to a seventh embodiment of the present disclosure. FIG. 10 illustrates an example of a schematic configuration of the information reproduction and recording apparatus 70. The information reproduction and recording apparatus 70 includes an optical apparatus 71 and an information processor 72, for example.

The information processor 72 acquires from the optical apparatus 71 information recorded in a recording medium 100 or transmits inputted information to the optical apparatus 71. On the other hand, the optical apparatus 71 is used as an optical pickup apparatus for high density recording and reproduction by means of a DVD, etc., for example, and includes a semiconductor laser LD as a light source and an optical system provided between a region where the recording medium 100 such as a DVD, etc. is placed and the semiconductor laser LD. The semiconductor laser LD is configured by any of the surface-emitting lasers 10 to 40 according to the foregoing respective embodiments and the modification examples thereof. A multitude of pits (protrusions) having size of a few m, for example, are formed on a surface of the recording medium 100. The optical system is disposed in an optical path from the semiconductor laser LD to the recording medium 100 and includes a grating (GRT) 82, a polarizing beam splitter (PBS) 83, a collimating lens (CL) 84, a quarter-wavelength plate (λ/4 plate) 85, and an objective lens (OL) 86. The optical system also includes a light-receiving device (PD) 88 such as a cylindrical lens (CyL) 87, a photodiode, etc. on the optical path separated by the polarizing beam splitter (PBS) 83.

In the optical apparatus 71, light from the light source (semiconductor laser LD) passes through the GRT 82, the PBS 83, the CL 84, the λ/4 plate 85, and the OL 86, focuses on the recording medium 100, and is reflected by the pits on the surface of the recording medium 100. The reflected light passes through the OL 86, the λ/4 plate 85, the CL 84, the PBS 83, and the CL 87 and enters the PD 88, and a pit signal, a tracking signal, and a focus signal are read.

In this manner, in the optical apparatus 71 of the present embodiment, any of the surface-emitting lasers 10 to 40 according to the foregoing respective embodiments and the modification examples thereof is used as the semiconductor laser LD, which thus allows the semiconductor laser LD to operate with high output or low consumed power.

Although description has been given of the present disclosure with reference to the embodiments, the present disclosure is not limited to the foregoing respective embodiments, and various modifications may be made thereto. It is to be noted that the effects described herein are merely illustrative. The effects of the present disclosure are not limited to those described herein. The present disclosure may include other effects than those described herein.

Moreover, for example, the present disclosure may have the following configurations.

(1)

A surface-emitting laser including:

a laminate having an active layer, and a first semiconductor layer and a second semiconductor layer having the active layer interposed therebetween;

a current constriction region being formed by impurities and having an opening, the impurities being injected from side of the second semiconductor layer into the laminate; and a first DBR layer on side of the first semiconductor layer and a second DBR layer on side of the second semiconductor layer, the first DBR layer and the second DBR layer having the laminate interposed therebetween at a position facing the opening, in which at the opening, an opening diameter close to the first DBR layer is larger than an opening diameter close to the second DBR layer.

(2)

The surface-emitting laser according to (1), in which at the opening, the opening diameter close to the first DBR layer is larger than the opening diameter close to the second DBR layer by λ/n or more.

(3)

The surface-emitting laser according to (1) or (2), in which the current constriction region includes a first impurity region and a second impurity region, the first impurity region and the second impurity region being concentrically annular-shaped and differing in depth and opening diameter from each other, a depth of the first impurity region is deeper than a depth of the second impurity region, and an opening diameter of the first impurity region is larger than an opening diameter of the second impurity region.

(4)

The surface-emitting laser according to (1) or (2), in which the current constriction region is configured by a plurality of impurity regions, the plurality of impurity regions being concentrically annular-shaped and differing in depth and opening diameter from one another, and an opening diameter of the impurity region having a relatively deep depth is larger than an opening diameter of the impurity region having a relatively shallow depth.

(5)

The surface-emitting laser according to any one of (1) to (4), in which the opening diameter of the opening increases continuously or intermittently from the side of the second DBR layer side toward the side of the first DBR layer side.

(6)

The surface-emitting laser according to (3), in which impurities forming the first impurity region and impurities forming the second impurity region differ from each other.

(7)

The surface-emitting laser according to any one of (1) to (6), in which the laminate is configured by a nitride semiconductor, and the current constriction region includes, as the impurities, one or more of oxygen, boron, chlorine, carbon, fluorine, boron, aluminum, nickel, copper, magnesium, and iron.

(8)

The surface-emitting laser according to any one of (1) to (7) further including:

an optically transparent electrode that is in contact with an outermost surface on the side of the second DBR layer of the laminate, in which the optically transparent electrode is in contact with an entire region facing at least the second DBR layer of the outermost surface.

(9)

An electronic apparatus including:

a surface-emitting laser as a light source, the surface-emitting laser including a laminate having an active layer, and a first semiconductor layer and a second semiconductor layer having the active layer interposed therebetween, a current constriction region being formed by impurities and having an opening, the impurities being injected from side of the second semiconductor layer into the laminate, and a first DBR layer on side of the first semiconductor layer and a second DBR layer on the side of the second semiconductor layer, the first DBR layer and the second DBR layer having the laminate interposed therebetween at a position facing the opening, in which at the opening, an opening diameter close to the first DBR layer is larger than an opening diameter close to the second DBR layer.

It should be understood that those skilled in the art could conceive various modifications, combinations, sub-combinations, and alterations depending on design requirements and other factors, insofar as they are within the scope of the appended claims or the equivalents thereof.

The invention claimed is:

1. A surface-emitting laser comprising:
   a laminate having an active layer, and a first semiconductor layer and a second semiconductor layer having the active layer interposed therebetween;
   a current constriction region being formed by impurities and having an opening, the impurities being injected from side of the second semiconductor layer into the laminate;
   a first distributed Bragg reflector (DBR) layer on side of the first semiconductor layer and a second DBR layer on side of the second semiconductor layer, the first DBR layer and the second DBR layer having the laminate interposed therebetween at a position facing the opening,
   wherein at the opening, an opening diameter close to the first DBR layer is larger than an opening diameter close to the second DBR layer; and
   an optically transparent electrode that is in contact with an outermost surface on the side of the second DBR layer of the laminate,
   wherein the optically transparent electrode is in contact with an entire region facing at least the second DBR layer of the outermost surface,
   wherein the opening diameter of the opening increases intermittently from the side of the second DBR layer toward the side of the first DBR layer, and
   wherein the current constriction region has a configuration selected from the group consisting of
   (i) the current constriction region includes a first impurity region and a second impurity region, the first impurity region and the second impurity region being concentrically annular-shaped and differing in depth and opening diameter from each other, a depth of the first impurity region is deeper than a depth of the second impurity region, and an opening diameter of the first impurity region is larger than an opening diameter of the second impurity region; and
   (ii) the current constriction region is configured by a plurality of impurity regions, the plurality of impurity regions being concentrically annular-shaped and differing in depth and opening diameter from one another, and an opening diameter of the impurity region having a relatively deep depth is larger than an opening diameter of the impurity region having a relatively shallow depth.

2. The surface-emitting laser according to claim 1, wherein impurities forming the first impurity region and impurities forming the second impurity region differ from each other.

3. The surface-emitting laser according to claim 1, wherein
   the laminate is configured by a nitride semiconductor, and
   the current constriction region includes, as the impurities, one or more of oxygen, boron, chlorine, carbon, fluorine, boron, aluminum, nickel, copper, magnesium, and iron.

4. The surface-emitting laser according to claim 1, wherein at the opening, the opening diameter close to the first DBR layer is larger than the opening diameter close to the second DBR layer by $\lambda/n$ or more, $\lambda$, represents an oscillation wavelength, and n represents a refractive index of the laminate.

5. An electronic apparatus comprising:
   a surface-emitting laser as a light source,
   the surface-emitting laser including
   a laminate having an active layer, and a first semiconductor layer and a second semiconductor layer having the active layer interposed therebetween,
   a current constriction region being formed by impurities and having an opening, the impurities being injected from side of the second semiconductor layer into the laminate,
   a first DBR layer on side of the first semiconductor layer and a second DBR layer on the side of the second semiconductor layer, the first DBR layer and the second DBR layer having the laminate interposed therebetween at a position facing the opening,
   wherein at the opening, an opening diameter close to the first DBR layer is larger than an opening diameter close to the second DBR layer, and
   an optically transparent electrode that is in contact with an outermost surface on the side of the second DBR layer of the laminate,
   wherein the optically transparent electrode is in contact with an entire region facing at least the second DBR layer of the outermost surface,
   wherein the opening diameter of the opening increases intermittently from the side of the second DBR layer toward the side of the first DBR layer, and
   wherein the current constriction region has a configuration selected from the group consisting of
   (i) the current constriction region includes a first impurity region and a second impurity region, the first impurity region and the second impurity region being concentrically annular-shaped and differing in depth and opening diameter from each other, a depth of the first impurity region is deeper than a depth of the second impurity region, and an opening diameter of the first impurity region is larger than an opening diameter of the second impurity region; and (ii) the current constriction region is configured by a plurality of impurity regions, the plurality of impurity regions being concentrically annular-shaped and differing in depth and opening diameter from one another, and an opening diameter of the impurity region having a relatively deep depth is larger than an opening diameter of the impurity region having a relatively shallow depth.

6. The electronic apparatus according to claim 5, wherein impurities forming the first impurity region and impurities forming the second impurity region differ from each other.

7. The electronic apparatus according to claim 5, wherein
the laminate is configured by a nitride semiconductor, and
the current constriction region includes, as the impurities, one or more of oxygen, boron, chlorine, carbon, fluorine, boron, aluminum, nickel, copper, magnesium, and iron.

8. The electronic apparatus according to claim 5, wherein at the opening, the opening diameter close to the first DBR layer is larger than the opening diameter close to the second DBR layer by $\lambda/n$ or more, $\lambda$, represents an oscillation wavelength, and n represents a refractive index of the laminate.

* * * * *